(12) United States Patent
Wang

(10) Patent No.: US 8,072,081 B2
(45) Date of Patent: Dec. 6, 2011

(54) MICROELECTROMECHANICAL SYSTEM PACKAGE

(75) Inventor: Meng Jen Wang, Pingtung (TW)

(73) Assignee: Advanced Semiconductor Engineering Inc., Pingtung (TW)

( * ) Notice: Subject to any disclaimer, the term of this patent is extended or adjusted under 35 U.S.C. 154(b) by 767 days.

(21) Appl. No.: 12/025,545

(22) Filed: Feb. 4, 2008

(65) Prior Publication Data
US 2008/0185699 A1 Aug. 7, 2008

(30) Foreign Application Priority Data

Feb. 6, 2007 (TW) .............................. 96104252 A

(51) Int. Cl.
H01L 23/495 (2006.01)
H01L 21/00 (2006.01)

(52) U.S. Cl. ......... 257/776; 257/E23.031; 257/E29.324; 257/E21.001; 257/98; 257/418; 257/660; 257/690; 257/419; 324/686; 361/283.1; 361/278; 361/287; 438/113

(58) Field of Classification Search .................. 257/676, 257/E23.031, 98, 418, 660, 690, E29.324, 257/E23.114, 419, 659, E21.001; 324/686; 361/283.1, 278, 287; 438/113
See application file for complete search history.

(56) References Cited

U.S. PATENT DOCUMENTS

| | | | |
|---|---|---|---|
| 6,781,231 B2 | 8/2004 | Minervini | |
| 6,784,020 B2 | 8/2004 | Lee et al. | |
| 7,358,106 B2 * | 4/2008 | Potter | 438/51 |
| 7,829,993 B2 * | 11/2010 | Murayama et al. | 257/686 |
| 2005/0056917 A1 | 3/2005 | Kwon | |
| 2005/0067633 A1 * | 3/2005 | Mushika | 257/202 |
| 2007/0092179 A1 * | 4/2007 | Park et al. | 385/14 |
| 2007/0205499 A1 * | 9/2007 | Wang et al. | 257/704 |
| 2007/0209437 A1 * | 9/2007 | Xue et al. | 73/514.31 |
| 2007/0235852 A1 * | 10/2007 | Yang et al. | 257/678 |
| 2007/0290364 A1 * | 12/2007 | Gupta et al. | 257/777 |
| 2008/0036053 A1 * | 2/2008 | Wu et al. | 257/666 |
| 2008/0061409 A1 * | 3/2008 | Yen et al. | 257/666 |
| 2008/0087987 A1 * | 4/2008 | Wang et al. | 257/659 |
| 2008/0131662 A1 * | 6/2008 | Jordan et al. | 428/141 |
| 2008/0188035 A1 * | 8/2008 | Seppala et al. | 438/106 |
| 2008/0217709 A1 * | 9/2008 | Minervini et al. | 257/416 |
| 2008/0218933 A1 * | 9/2008 | Mi et al. | 361/278 |
| 2008/0218934 A1 * | 9/2008 | Langereis et al. | 361/283.1 |
| 2009/0184403 A1 * | 7/2009 | Wang et al. | 257/659 |
| 2009/0263937 A1 * | 10/2009 | Ramakrishna et al. | 438/123 |
| 2010/0098863 A1 * | 4/2010 | O'Keefe et al. | 427/307 |
| 2010/0109103 A1 * | 5/2010 | Tsao | 257/418 |

FOREIGN PATENT DOCUMENTS

| | | |
|---|---|---|
| TW | 502413 | 9/2002 |
| TW | 560018 | 11/2003 |

* cited by examiner

Primary Examiner — A Williams

(57) ABSTRACT

A microelectromechanical system package includes a chip carrier, a first microelectromechanical system chip, a silicon cover, a layer of metal, a plurality of first bonding wires and a sealant. The first microelectromechanical system chip is positioned on the chip carrier and has an active surface, and an active area on the active surface. The layer of metal is formed on the upper surface of the cover. The first bonding wires electrically connect the active surface of the first microelectromechanical system chip to the chip carrier. The sealant is formed on the chip carrier to encapsulate the first microelectromechanical system chip and the first bonding wires.

20 Claims, 3 Drawing Sheets

MICROELECTROMECHANICAL SYSTEM PACKAGE

CROSS REFERENCE TO RELATED APPLICATION

This application claims the priority benefit of Taiwan Patent Application Serial Number 096104252 filed Feb. 6, 2007, the full disclosure of which is incorporated herein by reference.

BACKGROUND OF THE INVENTION

1. Field of the Invention

The invention relates to a microelectromechanical system package and the method for manufacturing the same, and more particularly, to a wafer-level microelectromechanical system package and the method for manufacturing the same.

2. Description of the Related Art

Referring to FIG. 1, a conventional microelectromechanical system package 100 includes a substrate 110 and a microelectromechanical system (MEMS) device 120 disposed on the substrate 110. A cover 130 is disposed on the substrate 110 to cover the MEMS device 120. A peripheral edge of the cover 130 is electrically connected to the substrate 110 by a conductive adhesive, solder, or the like 140. The cover 130 includes an outer cup 132a formed from a conductive layer of material such as copper, stainless steel, aluminum, or an alloy thereof. The cover 130 further includes an inner cup 132b. The inner cup 132b is also made of a conductive layer. An inner lining 150 is formed on the interior side of the inner cup 132b. The inner lining 150 is primarily formed by conductive material. The inner lining 150 protects the MEMS device 120 from electromagnetic interference.

The above-mentioned package 100 has the advantage of being able to shield the MEMS device 120 therein from external electromagnetic interference. However, the mass production of such packages 100 is difficult. Moreover, the package 100 has a large profile and therefore its application is quite limited.

Accordingly, there exists a need to provide a method for manufacturing a microelectromechanical system package to solve the above-mentioned problems.

SUMMARY OF THE INVENTION

It is an object of the present invention to provide a method for manufacturing microelectromechanical system packages that uses a wafer as a cover to protect the microelectromechanical system chips in the packages and the thickness of the package can therefore be reduced.

In order to achieve the above object, the method for manufacturing microelectromechanical system packages according to the present invention is to provide a first wafer that defines a plurality of units. These units are separated from each other by a plurality of scribe streets on the first wafer. The lower surface of the first wafer is etched to form a plurality of lower cavities in the units, respectively. The upper surface of the first wafer is also etched to form a plurality of upper cavities, wherein each of the upper cavities is formed across one of the scribe streets between an adjacent pair of the units. A layer of metal is formed on the upper surface of the first wafer and the upper cavities. The lower surface of the first wafer is bonded to a second wafer with a plurality of microelectromechanical system chips in such a manner that the active areas on the active surfaces of the microelectromechanical system chips are received in the lower cavities, respectively. Subsequently, the structure assembly of the first and second wafers is cut along the scribe streets to form individual microelectromechanical system chips.

The above microelectromechanical system chip can be mounted to a chip carrier. At least one bonding wire can be used to electrically connect the microelectromechanical system chip to the chip carrier. The layer of metal on the cover of the microelectromechanical system chip can be electrically connected to the ground trace of the chip carrier by a bonding wire to shield the microelectromechanical system chip in the package from external electromagnetic interference. In addition to the above microelectromechanical system chip, the package can also include other active or passive components on the chip carrier to enhance the function of the microelectromechanical system package. Finally, a sealant is formed on the chip carrier to encapsulate these components to better protect the microelectromechanical system package.

According to the method of the present invention, the microelectromechanical system chip in the microelectromechanical system package can be protected by a cover made from a wafer and therefore there is no need to arrange any additional cover to protect the microelectromechanical system chip. Accordingly, the thickness of the microelectromechanical system package can be reduced. Moreover, the layer of metal on the cover is able to shield the microelectromechanical system chip from external electromagnetic interference, thereby enhancing the performance of the microelectromechanical system package.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 2a to 2d illustrate the method for manufacturing microelectromechanical system chips according to the present invention, wherein FIG. 2b is a cross-sectional view taken from the line 2b-2b of FIG. 2a FIG. 3 is a cross-sectional view of the microelectromechanical system package of the present invention.

DETAILED DESCRIPTION OF THE PREFERRED EMBODIMENT

Figure 1:
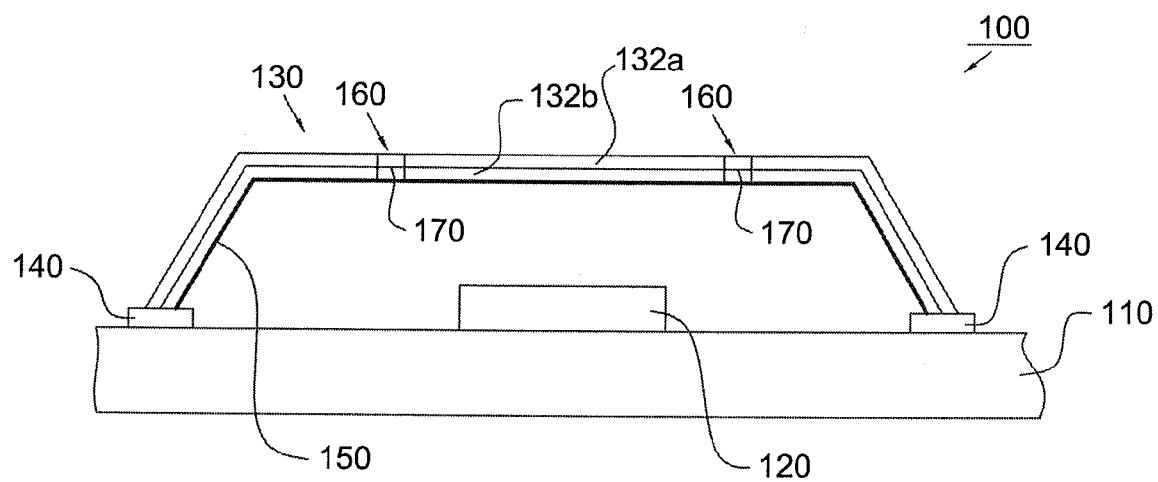
FIG. 1 is a cross-sectional view of a conventional microelectromechanical system package.
Figure 2A:
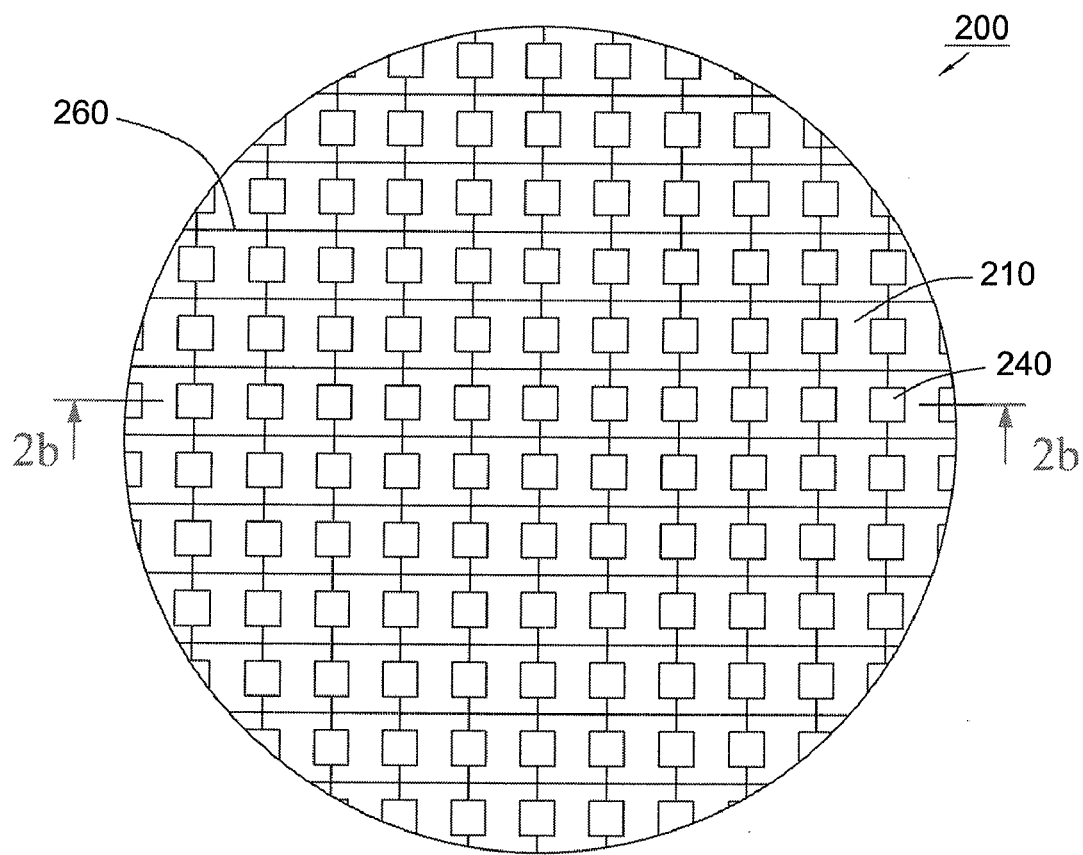
Figure 2B:
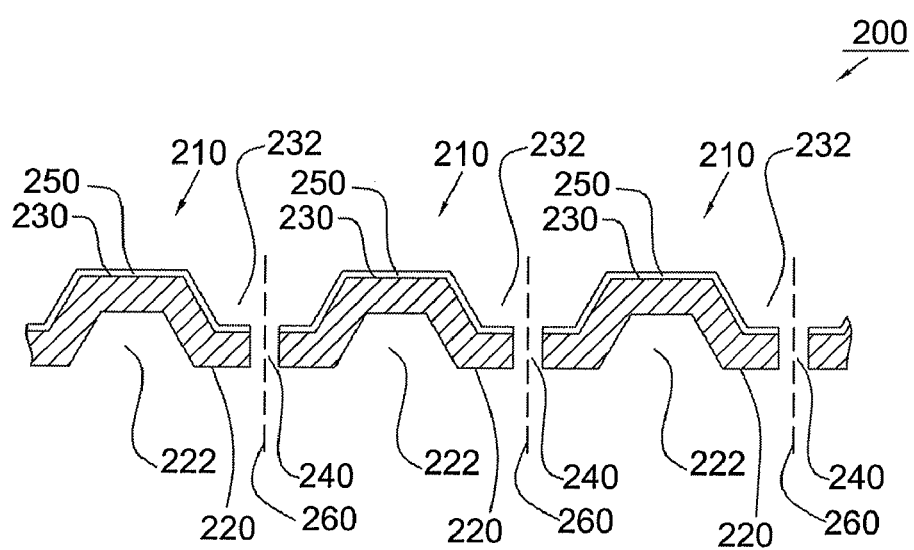

Referring to FIGS. 2a and 2b, the method for manufacturing microelectromechanical system (MEMS) chips according to the present invention is first to provide a cover 200, such as a silicon wafer. The cover 200 defines a plurality of units 210 and these units 210 are separated from each other by a plurality of scribe streets 260. The lower surface 220 of the cover 200 is etched to form a plurality of wedge-shaped cavities 222 in the units 210, respectively. The upper surface 230 of the cover 200 is also etched to form a plurality of cavities 232, wherein each of the cavities 232 is formed across one of the scribe streets 260 between an adjacent pair of the units 210. A plurality of through openings 240 is formed on the bottoms of the cavities 232 and penetrates to the lower surface 220 of the cover 200, respectively, and each of the openings 240 is located across one of the scribe streets 260 between an adjacent pair of the units 210. A layer of metal 250, such as a copper (Cu) layer, a gold (Au) layer or a Cu/Au layer is formed on the upper surface 230 of the cover 200 and the cavities 232 by sputtering or electroplating.

Figure 2C:
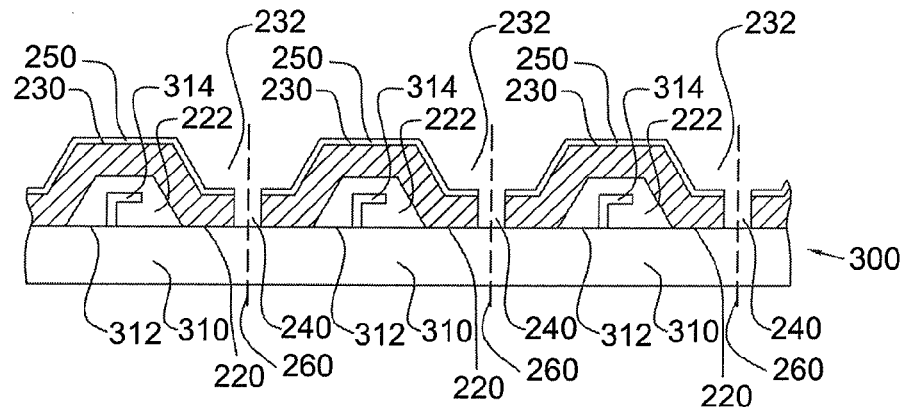

Referring to FIG. 2c, the lower surface 220 of the cover 200 is bonded to a wafer 300 with a plurality of MEMS chips 310 in such a manner that the active areas 314 on the active surfaces 312 of the chips 310 are received in the cavities 222, respectively. Subsequently, the structure assembly of the wafer 300 and cover 200 is cut along the scribe streets 260 to form individual MEMS chips 310 with their respective active areas 314 protected by the covers 320, and wherein each of the cavities 232 is cut into two halves as a result of the cutting (see FIG. 2d).

Figure 2D:
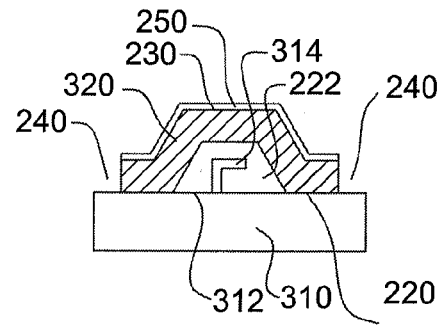
Figure 3:
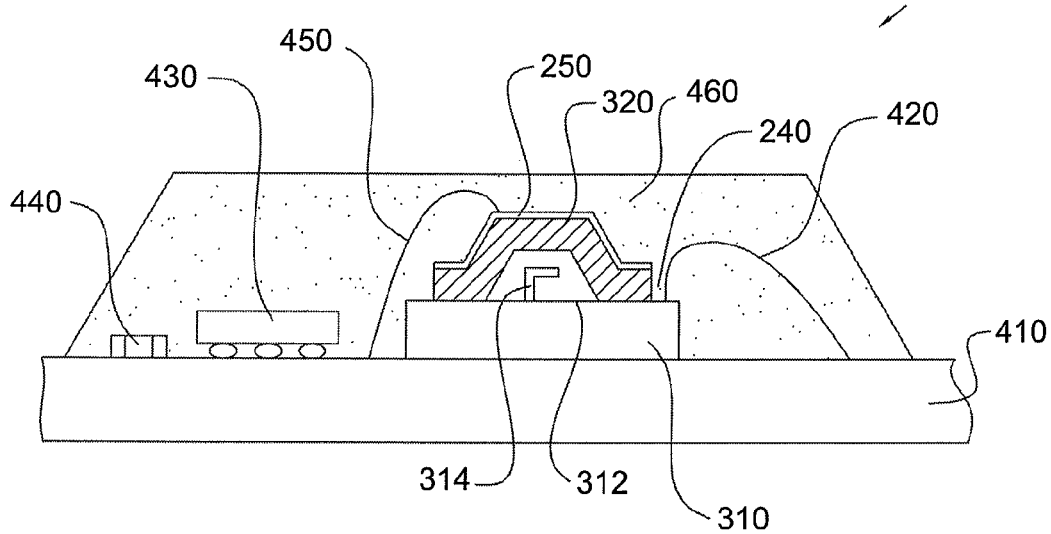

Referring to FIG. 3, the method for manufacturing a microelectromechanical system package 400 according to the present invention is to configure the MEMS chip 310 of FIG. 2d with other components. For example, the MEMS chip 310 can be mounted to a chip carrier 410, such as a substrate or a leadframe. At least one bonding wire 420 is bonded from the active surface 312 of the chip 310 through the opening 240 of the cover 320 to the chip carrier 410 to electrically connect the chip 310 to the carrier 410. In addition to the MEMS chip 310, the MEMS package 400 can also include other active component 430 or passive component 440 mounted on the chip carrier 410 to enhance the function of the MEMS package 400. Moreover, the layer of metal 250 on the cover 320 can be electrically connected to the ground trace of the chip carrier 410 (not shown in the figure) by a bonding wire 450 to shield the MEMS chip 310 from external electromagnetic interference. Finally, to better protect the MEMS package 400, a sealant 460 can be formed on the chip carrier 410 to encapsulate the MEMS chip 310, components 430, 440 and bonding wires 420, 450.

According to the method of the present invention, the MEMS chip in the MEMS package can be protected by a cover made from a wafer. The thickness of the MEMS package can therefore be reduced. Moreover, the layer of metal formed on the cover is able to shield the MEMS chip from external electromagnetic interference, thereby enhancing the performance of the MEMS package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A microelectromechanical system package, comprising:
   a chip carrier;
   a first microelectromechanical system chip positioned on the chip carrier, wherein the first microelectromechanical system chip has an active surface and an active area on the active surface;
   a silicon cover covering the active area of the first microelectromechanical system; chip, wherein the silicon cover defines a wedge-shaped cavity and the active area of the first microelectromechanical system chip is positioned within the wedge-shaped cavity;
   a layer of metal formed on the upper surface of the cover;
   a plurality of first bonding wires electrically connecting the active surface of the first microelectromechanical system chip to the chip carrier; and
   a sealant formed on the chip carrier to encapsulate the first microelectromechanical system chip and the first bonding wires.

2. The microelectromechanical system package as claimed in claim 1, further comprising:
   a second bonding wire electrically connecting the layer of metal to the chip carrier.

3. The microelectromechanical system package as claimed in claim 1, wherein the layer of metal is a copper/gold layer.

4. The microelectromechanical system package as claimed in claim 1, wherein the chip carrier is a substrate.

5. The microelectromechanical system package as claimed in claim 1, wherein the chip carrier is a leadframe.

6. The microelectromechanical system package as claimed in claim 1, further comprising:
   a second active component positioned on the chip carrier.

7. The microelectromechanical system package as claimed in claim 1, further comprising:
   a passive component positioned on the chip carrier.

8. The microelectromechanical system package as claimed in claim 1, wherein the layer of metal is formed on the entire upper surface of the silicon cover.

9. The microelectromechanical system package as claimed in claim 1, wherein
   the silicon cover covers less than an entirety of the active surface of the first microelectromechanical system chip, and
   the first bonding wires are connected to regions of the active surface of the first microelectromechanical system chip, which regions are not covered by the silicon cover.

10. The microelectromechanical system package as claimed in claim 1, wherein the layer of metal is an electroplating metal layer.

11. The microelectromechanical system package as claimed in claim 1, wherein the layer of metal is a sputtering metal layer.

12. The microelectromechanical system package as claimed in claim 6, wherein the sealant further encapsulates the second active component.

13. The microelectromechanical system package as claimed in claim 7, wherein the sealant further encapsulates the passive component.

14. The microelectromechanical system package as claimed in claim 2, wherein the second bonding wire is electrically connected to a ground trace of the chip carrier.

15. A microelectromechanical system package, comprising:
   a chip carrier;
     a microelectromechanical system (MEMS) chip positioned on the chip carrier, wherein the MEMS chip has opposite upper and lower surfaces, the upper surface being an active surface of the MEMS chip and having an active area;
     a silicon cover bonded to the active surface of the MEMS chip and covering the active area of the MEMS chip, said cover having opposite upper and lower sides, said cover having on the lower side that faces the active surface of the MEMS chip a cavity in which the active area of the MEMS chip is received;
     a layer of metal formed on the upper side of the cover;
     a plurality of bonding wires electrically connecting the active surface of the MEMS chip to the chip carrier; and
     a sealant formed on the chip carrier to encapsulate the MEMS chip and the bonding wires.

16. The microelectromechanical system package as claimed in claim 15, further comprising:
   a further bonding wire electrically connecting the layer of metal on the upper side of the cover to the ground.

17. The microelectromechanical system package as claimed in claim 15, wherein
   the silicon cover covers less than an entirety of the active surface of the MEMS chip, and the bonding wires are connected to regions of the active surface that are not covered by the silicon cover.

18. A microelectromechanical system package, comprising:
- a chip carrier;
- a microelectromechanical system (MEMS) chip positioned on the chip carrier, wherein the MEMS chip has an active surface and an active area on the active surface;
- a silicon cover covering the active area of the MEMS chip, wherein the silicon cover includes a plurality of lateral surfaces connecting to the active surface of the MEMS chip;
- a layer of metal formed on the upper surface of the cover, wherein the lateral surfaces are free of being covered by the layer of metal;
- a plurality of bonding wires electrically connecting the active surface of the MEMS chip to the chip carrier; and
- a sealant formed on the chip carrier to encapsulate the MEMS chip and the bonding wires.

19. The microelectromechanical system package as claimed in claim 18, wherein the layer of metal is formed on the entire upper surface of the silicon cover.

20. The microelectromechanical system package as claimed in claim 19, wherein the lateral surfaces are perpendicular to the active surface of the first microelectromechanical system chip.

* * * * *